United States Patent [19]

Kray

[11] Patent Number: 4,578,328

[45] Date of Patent: Mar. 25, 1986

[54] PHOTOPATTERNABLE POLYIMIDE COMPOSITIONS AND METHOD FOR MAKING

[75] Inventor: William D. Kray, San Bernadino, Calif.

[73] Assignee: General Electric Company, Waterford, N.Y.

[21] Appl. No.: 628,923

[22] Filed: Jul. 9, 1984

[51] Int. Cl.[4] .................... G03C 5/16; G03C 1/70; G03C 1/76

[52] U.S. Cl. .................... 430/18; 430/282; 430/283; 430/284; 430/325; 430/327; 430/330; 430/927; 430/272; 430/270

[58] Field of Search ............... 430/282, 283, 284, 325, 430/327, 330, 927, 272, 18, 270

[56] References Cited

U.S. PATENT DOCUMENTS

| | | | |
|---|---|---|---|
| Re. 30,186 | 1/1980 | Rubner et al. | 430/283 X |
| 2,965,553 | 12/1960 | Dixon et al. | 204/159.15 |
| 3,325,450 | 6/1967 | Holub | 528/21 |
| 3,553,282 | 1/1971 | Holub | 528/21 X |
| 3,622,321 | 11/1971 | Smets et al. | 430/270 |
| 3,902,902 | 9/1975 | Kleeburg et al. | 430/325 |
| 4,030,948 | 6/1977 | Berger | 428/447 |
| 4,266,005 | 5/1981 | Nakamura et al. | 430/271 |
| 4,410,612 | 10/1983 | Goff et al. | 430/283 |

FOREIGN PATENT DOCUMENTS 0065352 11/1982 European Pat. Off. .......... 430/283

OTHER PUBLICATIONS

W. S. DeForest, *Photoresist,* McGraw-Hill Book Company, 1975, New York, N.Y., pp. 89-109.

T. F. Saunders et al., "Photosensitive Polyimide Coatings", IBM Technical Disclosure Bulletin, vol. 16, No. 2, Jul. 1973, pp. 601-602.

R. Rubner et al., "Production of Highly Heat-Resistant Film Patterns from Photoreactive Polymeric Precursors, Part 2, Polyimide Film Patterns", Siemens Forschiu, Entwickl. Ber. Bd. 5, 1976, No. 4, pp. 235-239.

*Primary Examiner*—John E. Kittle
*Assistant Examiner*—Cynthia Hamilton
*Attorney, Agent, or Firm*—Gary L. Loser

[57] ABSTRACT

There is provided an article of manufacture prepared by (A) applying a coating of a solution containing a polymer having at least one pendant aromatic group and a bis-maleimide to a substrate;

(B) allowing the coated substrate to dry;

(C) exposing the coated substrate to a source of light for a time sufficient to effect crosslinking of said polymer having at least one pendant organic group and said bis-maleimide; and (D) developing the exposed substrate.

18 Claims, No Drawings

PHOTOPATTERNABLE POLYIMIDE COMPOSITIONS AND METHOD FOR MAKING

CROSS REFERENCE TO RELATED APPLICATIONS

Reference is made to my copending patent application, Ser. No. 573,883, filed Jan. 24, 1984, for "Photopatternable Dielectric Compositions and Methdos for Making and Using" and the copending patent application of Gary C. Davis, Ser. No. 527,581, filed Aug. 29, 1983, for "Photopatternable Dielectric Compositions, Method for Making and Use", both of which are assigned to the same assignee as the present invention.

BACKGROUND OF THE INVENTION

The present invention relates to novel photoresist compositions and methods of making and using such compositions. More particularly, the present invention provides photolithographic methods for making photoresists by applying a mixture of a polyimide having at least one pendant aromatic radical and a bis-maleimide to a substrate and allowing it to dry, and thereafter exposing the thus treated substrate while it is masked to a source of light so as to effect crosslinking of the polyimide and bis-maleimide.

Prior to the present invention polyimides and polysiloxane imides were obtained by effecting reaction between a carboxylic acid dianhydride and a diamino compound and/or diaminopolysiloxane to obtain an initial reaction product having the formula, for example,

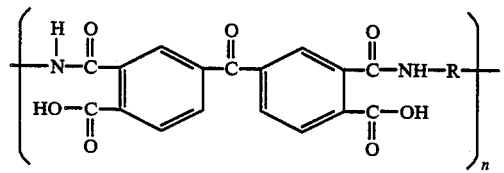

R = aliphatic and/or aromatic and/or siloxane

Upon heating at a temperature of about 150° C. to 350° C. the polymeric amido compound cyclized to yield an imidized composition of recurring units of the formula, for example,

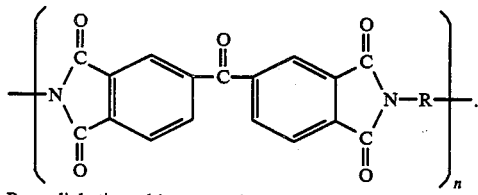

R = aliphatic and/or aromatic and/or siloxane

This method is described more fully in U.S. Pat. Nos. 3,325,450 and 3,553,282, among other patents and literature references.

Photoresist materials which are based on a photoreactive precursor are described by Rubner et al. in "Production of Highly-Heat Resistant Film Patterns from Photoreactive Polymeric Precursors, Part I, General Principles (January: 1976)" and "Production of Highly-Heat Resistant Film Patterns from Photoreactive Polymeric Precursors, Part 2, Polyimide Film Patterns (May 1976)". A photoreactive polyamide is made by initially effecting reaction between an aromatic dianhydride, for example, pyromellitic dianhydride, and allyl alcohol. The resulting aromatic dicarboxylic acid diester is then converted to the corresponding aromatic diacid chloride by reaction with thionyl chloride. The diacid chloride is further reacted with an aromatic diamine to produce a photoreactive aromatic polyamide ester. The aforementioned photoreactive polyimide precursor is then applied to a substrate, for example by spin coating, and exposed to light with the aid of a mask, followed by developing the treated surface with an organic solvent to produce a photoresist. The aromatic patterned polyamide ester is then heated to convert it to a patterned polyimide.

Although valuable results have been achieved with the aforementioned photoreactive aromatic polyamide ester, those skilled in the art recognize that the use of a chlorinating agent such as thionyl chloride to convert the aromatic dicarboxylic acid to the corresponding acid chloride prior to the polymerization reaction with aromatic diamine can result in the introduction of residual chloride contamination. Such chloride contamination can interfere with the utility of the resulting aromatic polyimide as a dielectric.

It is also desirable to avoid the heating step required in the foregoing process which is necessary to convert the patterned polyamide ester to a patterned polyimide.

It is, therefore, desirable to provide a photosensitive composition useful as a photoresist and convertible to a patterned insulating layer which does not require heating to effect imidization.

SUMMARY OF THE INVENTION

It is one object of the present invention to provide an article comprising a substrate having an insulative layer thereon.

It is another object of the present invention to provide a method for patterning an insulative layer on a substrate.

In accordance with at least one object of the present invention there is provided a method for patterning an insulative layer on a substrate, comprising:

(A) applying a coating of a solution containing a polymer having at least one pendant aromatic group and at least one bis-maleimide to a substrate in the substantial absence of light;

(B) allowing the coated substrate to dry;

(C) exposing the coated substrate to a source of light for a time sufficient to effect crosslinking of said polymer having at least one pendant aromatic group and said bis-maleimide; and (D) developing the exposed substrate.

In another aspect of the present invention there is provided an article prepared in accordance with the foregoing method.

DESCRIPTION OF THE INVENTION

In accordance with the present invention, a polymer having at least one pendant aromatic group can be prepared by reacting a dianhydride of the general formula

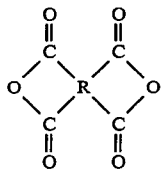
(1)

with a diamine of the general formula $H_2N—R^1—NH_2$ (2)

to obtain a polyamide acid consisting essentially of chemically combined units of the formula

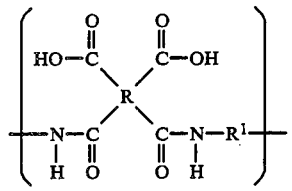
(3)

where R is a tetravalent organic radical or a tetravalent organosiloxane-containing radical and $R^1$ is a divalent organic radical or a divalent organosiloxane-containing radical.

Generally, it is not critical what dianhydride and diamine are employed and the skilled artisan can readily select those most suitable for his contemplated use. The only critical limitation is that either the dianhydride or the diamine must include at least one pendant aromatic group. Typically such pendant aromatic radical will be bonded to $R^1$ of a diamine of formula (2).

Suitable dianhydrides and their method of preparation are described in U.S. Pat. Nos. 3,553,282 to Holub and 4,030,948 to Berger, both of which are incorporated by reference into the instant disclosure. Illustrative of dianhydrides or dianhydrides which can easily be modified for use in the present invention are
pyromellitic dianhydride;
2,3,6,7-naphthalene tetracarboxylic acid dianhydride;
3,3',4,4'-diphenyl tetracarboxylic acid dianhydride;
1,2,5,6-naphthalene tetracarboxylic acid dianhydride;
2,2',3,3'-diphenyl tetracarboxylic acid dianhydride;
2,2-bis(3,4-dicarboxyphenyl)propane dianhydride;
bis(3,4-dicarboxyphenyl)sulfone dianhydride;
3,4,3,10-perylene tetracarboxylic acid dianhydride;
bis(3,4-dicarboxyphenyl)ether dianhydride;
2,2-bis(2,3-dicarboxyphenyl)propane dianhydride;
1,1-bis(2,3-dicarboxyphenyl)ethane dianhydride;
bis(3,4-dicarboxyphenyl)methane dianhydride;
bis(2,3-dicarboxyphenyl)sulfone dianhydride; and
benzophenone tetracarboxylic acid dianhydride.

Generally the preferred dianhydrides of formula (1) are where R is a tetravalent $C_{(6-30)}$ aromatic radical selected from

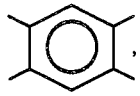

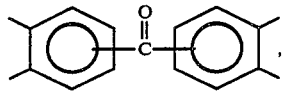

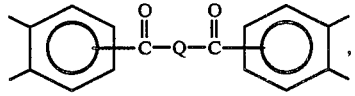

and

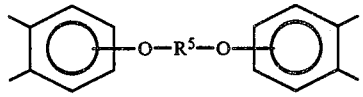

where Q is a divalent radical having the formula $—ZR^6Z—$ where Z is selected from $—O—$ and $—NH—$, and $R^5$ and $R^6$ are selected from $C_{(2-13)}$ organic radicals.

Also acyclic or cyclic aliphatic dianhydrides such as cyclopentane tetracarboxylic acid dianhydride, cyclohexane tetracarboxylic acid dianhydride, butane tetracarboxylic acid dianhydride and the like are suitable for use in the present invention.

Organosiloxane-containing dianhydrides are also within the scope of the present invention and preferably have the general formula

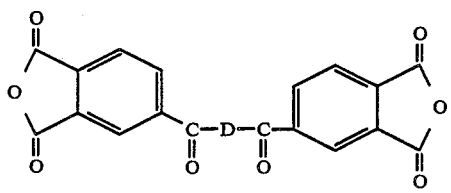
(5)

where D is a di-nitrogen or di-oxygen terminated siloxane. Dianhydrides of formula (5) can be prepared by reacting trimellitic chloride, i.e.

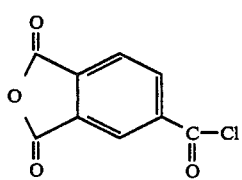

with any diamine or dialcohol having siloxane linkages. Accordingly, siloxane-containing dianhydrides of the present invention have formulas such as, for example,

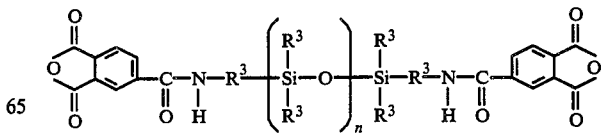

and

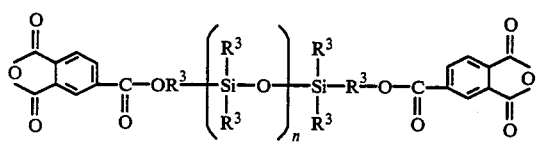

where R³ is a substituted or unsubstituted hydrocarbon radical, preferably having from 1 to 8 carbon atoms, and n has a value of from 1 to about 200 and preferably from 1 to about 100.

The most preferred dianhydrides are pyromellitic dianhydride, benzophenone tetracarboxylic acid dianhydride and

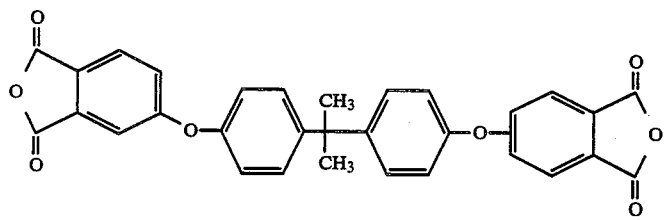

Illustrative of the aminosiloxanes which can be reacted with trimellitic chloride to obtain siloxane-containing dianhydrides are

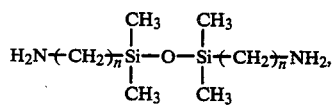

where n preferably equals 2 through 6 inclusive and most preferably equals 3.

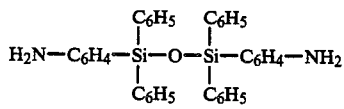

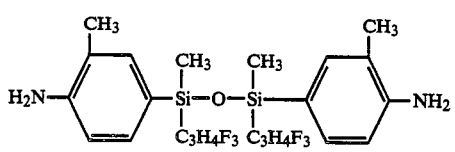

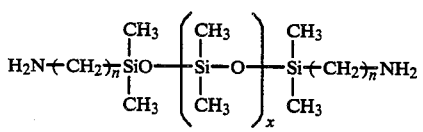

where n is as previously defined and

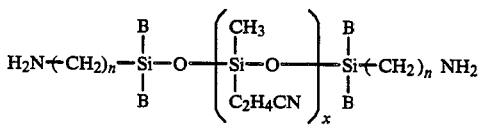

B = CH₃ and/or phenyl where n is as previously defined. Of course, dialcohol end-stopped compounds can be used in place of the diamino end-stopped compounds. In either case, the method for preparing the siloxane-containing dianhydrides is well known to those skilled in the art.

Generally R¹ of the diamine of formula (2) has the formula

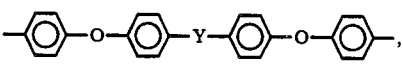

where Y is

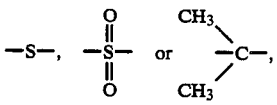

where Z is

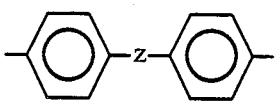

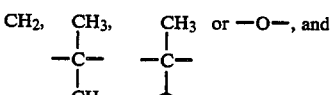

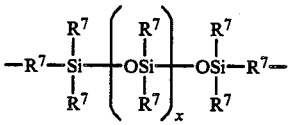

where R⁷ is a C$_{(1-13)}$ organic radical and x=1 to about 200. Of course, other variations will be obvious to the skilled artisan. Preferably, the pendant aromatic group is bonded to one of the foregoing radicals, which most preferably is an organosiloxane-containing radical.

Diamines or modifications thereof which include at least one pendant aromatic group which can be reacted with the foregoing dianhydrides to obtain non-photosensitive polyamide acids are well known in the art and are also described in U.S. Pat. Nos. 3,553,282 and 4,030,948. Diamines within the scope of formula (2) include for example,
m-phenylenediamine;
p-phenylenediamine;
4,4'-diaminodiphenylpropane;
4,4'-diaminodiphenylmethane;
benzidine;

4,4'-diaminodiphenylsulfide;
4,4'-diaminodiphenyl sulfone;
4,4'-diaminodiphenyl ether;
1,5-diaminonaphthalene;
3,3'-dimethoxybenzidine
2,4-bis(B-amino-t-butyl)toluene;
1,3-diamino-4-isopropylbenzene;
m-xylenediamine;
p-xylenediamine;
2,2-dimethylpropylenediamine;
1,4-cyclohexanediamine; and
bis(3-aminopropyl)sulfide.

This listing of suitable amines, as with the previous listing of suitable dianhydrides, is not intended to be exclusive as those skilled in the art recognize that a complete listing is not feasible. It should be noted that in addition to organic diamines, there are also included within the scope of formula (2) di(aminoalkyl)polysiloxanes as disclosed hereinabove for reaction with trimellitic chloride to obtain dianhydrides.

The reaction product of the dianhydride and the diamine is a polyamide acid of chemically combined units of formula (3), i.e.,

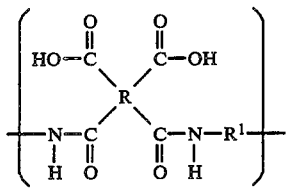

where R is the tetravalent organic or organosiloxane-containing radical of the dianhydride and $R^1$ is the divalent organic or organosiloxane-containing radical of the diamine.

A polyimide can be prepared from such polymer by heating at a temperature of about 150° C. to about 350° C. as taught in U.S. Pat. Nos. 3,325,450 and 3,553,282 which are incorporated herein by reference.

Alternatively, such reaction product of a dianhydride and diamine can be made photosensitive in accordance with my copending patent application, Ser. No. 573,883, filed Jan. 24, 1984, and which is incorporated herein by reference.

Briefly, my copending patent application teaches the art that polyamide acids of formula (3) can be reacted with photosensitive acrylates, cinnamates or 2,3-diphenylcyclopropenol ester to yield a photosensitive polyamide acid composition of the formula

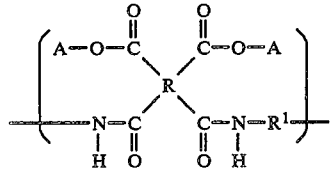

(4)

where R and $R^1$ are as previously defined and A is a photoreactive acrylate, cinnamate or 2,3-diphenylcyclopropenol ester. Preferably, the photosensitive acrylates, cinnamates, or 2,3-diphenylcyclopropenol ether has the formula

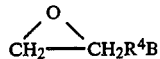

where $R^4$ is a divalent organic radical, preferably alkyl, having from 1 to 8 carbon atoms and B is the photosensitive group.

Such photosensitive polyamide acid can then be exposed to a suitable light source to effect crosslinking in addition to that between the polymer having at least one pendant aromatic group and the bis-maleimide, described more fully hereinbelow. Imidization of the photosensitive polyamide acid units can thereafter be effected by heating.

Bis-maleimides suitable for practicing the present invention have the general formula

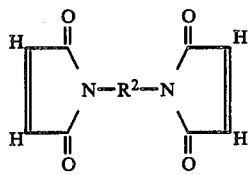

where $R^2$ is a divalent organic organic radical or a divalent organosiloxane-containing radical. Preferably, $R^2$ is an organosiloxane-containing radical of the formula

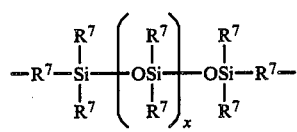

where $R^7$ is a $C_{(1-13)}$ organic radical and x equals from 1 to about 200.

The polymer having at least one pendant aromatic radical, whether already imidized or an amide acid containing photosensitive radicals, and the bis-maleimide preferably are dissolved in a suitable inert solvent such as tetrahydrofuran, dimethylformamide, N-methylpyrrolidinone, dimethylsulfoxide, or ethyleneglycoldimethoxyether. The percent solids of such solution can range anywhere from about 5 to about 95 percent by weight solids, but most preferably ranges from about 5 to about 25 percent by weight solids.

The substrate surface, which typically is a silicon wafer, must be properly cleaned to ensure adequate resist wetting and adhesion.

There are several methods by which a substrate may be coated with the photoresist. The method chosen will depend on the need for uniformity and the thickness of the coating desired. Spin coating is particularly advantageous in the microelectronics industry where a thin uniform coating of a photoresist is applied to one side of a small part of the substrate and where a high degree of uniformity is desirable. In spin coating the thickness of the resulting film is controlled by adjusting the spinning speed and the solids content of the resist solution.

Other methods of applying the photoresist to the substrate are spray coating, dip coating and roller coating. Spray coating is probably the best way to apply a thick coating, however, it results in waste of the photoresist material. Dip coating provides the most uniform coatings but it is relatively slow and has limitations in coating thickness. Roller coating is a method of uniformly applying very thin coatings to rigid surfaces.

After applying the photoresist to the substrate it is often desirable, though optional, to oven dry or pre-exposure bake the photoresist. This bake eliminates residual solvent, promotes adhesion, and hardens the resist. Temperature and time depend upon the specific resist being used, but generally are from 70°–90° C. and 10–30 minutes, respectively.

The photoresist is then masked so that when it is exposed to a light source crosslinking will be effected only where the resist is exposed to such light source.

Several techniques are known for carrying out the exposure. The oldest and probably most widely used technique is contact printing in which the wafer is pushed into intimate contact with a mask and then the mask is flooded with light. In proximity printing the mask and wafer are separated by a gap, nominally from 10 to 25 mm. In projection printing a high quality lens or mirror system is used to project the mask image onto the wafer surface. The purpose of the exposure step is to crosslink the photoreactive portions of the photoresist that were exposed to the light while the masked or unexposed portions remain uncrosslinked and hence soluble in selected solvents.

During such exposure, in accordance with the present invention, the polyimide polymer having a pendant aromatic group is photolytically crosslinked with the bis-maleimide via a 1,2-cycloaddition reaction as follows:

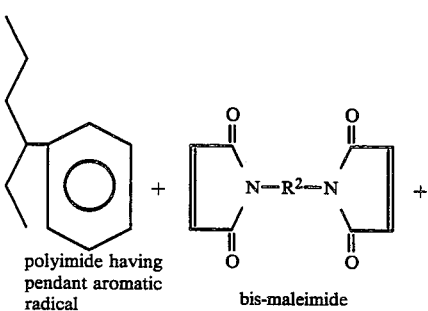
polyimide having pendant aromatic radical  bis-maleimide

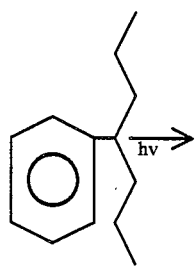

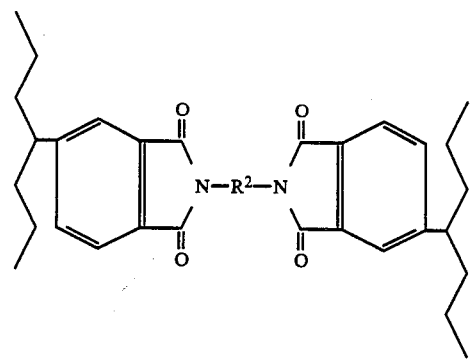

where $R^2$ is as previously defined.

Development of the photoresist involves contacting the exposed photoresist with a solvent wherein the crosslinked material is insoluble but wherein the uncrosslinked polymers are soluble. This leaves a tough, chemically resistant, insulating layer on the surface of the substrate.

I claim:

1. A method for patterning an insulative layer on a substrate, comprising:
   (A) applying a coating of a solution comprising a polyimide polymer having at least one pendant aromatic group and at least one bis-maleimide to a substrate in the substantial absence of light;
   (B) allowing the coated substrate to dry;
   (C) masking the coated substrate;
   (D) exposing the masked substrate to a source of light for a time sufficient to effect crosslinking of said polymer having at least one pendant aromatic group and said bis-maleimide; and
   (E) developing the exposed substrate.

2. The method of claim 1 wherein the polymer having at least one pendant aromatic group is prepared by reacting a dianhydride of the formula

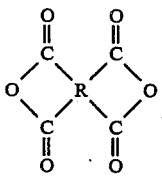

with a diamine of the formula $$H_2N-R^1-NH_2$$

where R is a tetravalent organic radical or a tetravalent organosiloxane-containing radical, and $R^1$ is a divalent organic radical or a divalent organosiloxane-containing radical.

3. The method of claim 2 wherein the reaction product of the dianhydride and the diamine is further reacted with a photosensitive compound of the formula

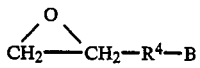

where $R^4$ is a divalent radical having from 1 to 8 carbon atoms and B is a photosensitive acrylate, cinnamate or 2,3-diphenylcyclopropenol ester radical.

4. The method of claim 2 or 3 wherein the reaction product of the dianhydride and the diamine is imidized by heating at a temperature of from about 150° C. to about 350° C.

5. The method of claim 1 wherein the bis-maleimide has the formula

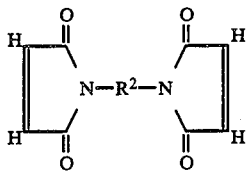

where $R^2$ is a divalent organic radical or a divalent organosiloxane-containing radical.

6. The method of claim 1 wherein step (A) is effected by spin coating.

7. The method of claim 1 wherein the substrate of step (A) is a silicon wafer.

8. The method of claim 1 wherein step (B) is effected by heating.

9. The method of claim 1 wherein step (D) is effected by contact printing.

10. An article of manufacture prepared by a method comprising:

(A) applying a coating of a solution comprising polyimide polymer having at least one pendant aromatic group, and at least one bis-maleimide to a substrate in the substantial absence of light;

(B) allowing the coated substrate to dry;

(C) masking the coated substrate;

(D) exposing the masked substrate to a source of light for a time sufficient to effect crosslinking of said polymer having at least one pendant aromatic group and said bis-maleimide; and (E) developing the exposed substrate.

11. The article of claim 10 wherein the polymer having at least one pendant aromatic group is prepared by reacting a dianhydride of the formula

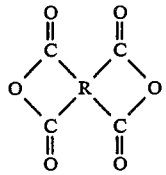

with a diamine of the formula $$H_2N-R^1-NH_2$$

where R is a tetravalent organic radical or a tetravalent organosiloxane-containing radical, and $R^1$ is a divalent organic radical or a divalent organosiloxane-containing radical.

12. The article of claim 11 wherein the reaction product of the dianhydride and the diamine is further reacted with a photosensitive compound of the formula

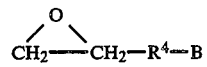

where $R^4$ is a divalent radical having from 1 to 8 carbon atoms and B is a photosensitive acrylate, cinnamate or 2,3-diphenylcyclopropenol ester radical.

13. The article of claim 11 or 12 wherein the reaction product of the dianhydride and the diamine is imidized by heating at a temperature of from about 150° C. to about 350° C.

14. The article of claim 10 wherein the bis-maleimide has the formula

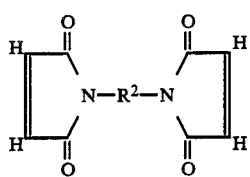

where $R^2$ is a divalent organic radical or a divalent organosiloxane-containing radical.

15. The article of claim 10 wherein the substrate in step (A) is a silicon wafer.

16. The article of claim 10 wherein step (A) is effected by spin-coating.

17. The article of claim 10 wherein step (B) is effected by heating.

18. The article of claim 10 wherein step (D) is effected by contact printing.

* * * * *